United States Patent [19]
Kitamura

[11] Patent Number: 5,548,609
[45] Date of Patent: Aug. 20, 1996

[54] EXTERNAL RESONATOR TYPE WAVELENGTH-VARIABLE SEMICONDUCTOR LASER LIGHT SOURCE

[75] Inventor: Atsushi Kitamura, Tokyo, Japan

[73] Assignee: Ando Electric Co., Ltd., Tokyo, Japan

[21] Appl. No.: 394,520

[22] Filed: Feb. 27, 1995

[30] Foreign Application Priority Data

Feb. 28, 1994 [JP] Japan .................................. 6-054582

[51] Int. Cl.⁶ ....................................................... H01S 3/08
[52] U.S. Cl. .......................... 372/92; 372/100; 372/102; 372/98
[58] Field of Search .............................. 372/97, 92, 100, 372/99, 98, 102

[56] References Cited

U.S. PATENT DOCUMENTS 3,597,701  8/1971  Cornillault ................................ 372/100
3,855,547  12/1974  Kirk ........................................ 372/100

*Primary Examiner*—Leon Scott, Jr.
*Attorney, Agent, or Firm*—Finnegan, Henderson, Farabow, Garrett & Dunner, L.L.P.

[57] ABSTRACT

The purpose of the present invention is to provide an external resonator type wavelength-variable semiconductor laser light source adopting a "sine bar" method, in which the oscillation wavelength of the semiconductor laser can be varied within a wide range under phase-continuous conditions. In the external resonator type wavelength-variable semiconductor laser light source according to the present invention, the semiconductor laser outputs an outgoing beam from one end face coated with an antireflection film. The outgoing beam transmits the first and second prisms to be incident on a diffraction grating fixed on a rotating stage. When the second prism slides on a slope of the first prism, an arm which is connected to the second prism works together, and the diffraction grating rotates. At this time, the optical length of the beam which transmits the second prism changes, while the length of resonator does not change.

6 Claims, 2 Drawing Sheets

EXTERNAL RESONATOR TYPE WAVELENGTH-VARIABLE SEMICONDUCTOR LASER LIGHT SOURCE

BACKGROUND OF THE INVENTION

1. Field of the Invention

The present Invention relates to an external resonator type wavelength-variable semiconductor laser light source for optical coherent communication, which varies the oscillation wavelength of the semiconductor laser while continuing the phase of oscillated light.

2. Background Art

FIG. 2 is a block diagram showing a conventional external resonator type wavelength-variable semiconductor laser light source. In FIG. 2, reference numeral 1 indicates a semiconductor laser, reference numeral 1A indicates an antireflection film, reference numeral 3 indicates a diffraction grating, reference numeral 4 indicates a rotating stage, reference numerals 5 and 6 indicate lenses, reference numeral 7 indicates an arm, and reference numeral 10 indicates a fixed plate.

In the arrangement of FIG. 2, one end face of semiconductor laser 1 is coated with antireflection film 1A. From the end face with the antireflection film, outgoing beam 2B is outputted. The outgoing beam 2B is transformed into a collimated beam by lens 6 and is incident on diffraction grating 3 which has grooves whose interval is d, the diffraction grating being placed in a direction inclined by angle $\theta_0$ to a direction along the optical axis of semiconductor laser 1.

At this time, the central part of the diffraction grating 3 and the other end face without an antireflection film of the semiconductor laser 1 form an external resonator which has initial length $L_0$. Therefore, semiconductor laser 1 oscillates at initial wavelength $\lambda_{Gr0}$ which corresponds to a mode selected among initial external resonance longitudinal modes $\lambda_{FP0}$ (the interval of the modes is represented by $\lceil \lambda_{FP0}^2/2L_0 \rceil$) so as to satisfy a condition that the optical loss in the resonator is the smallest via the diffraction grating 3. Here, initial external resonance longitudinal modes $\lambda_{FP0}$ satisfy the following formula (1), and initial wavelength $\lambda_{Gr0}$ is represented by the following formula (2). Wavelength $\lambda$ of semiconductor laser 1 can be varied by rotating diffraction grating 3.

$$\lambda_{FP0} = 2L_0/m \quad (1)$$

wherein:

$\lambda_{FP0}$: initial external resonance longitudinal modes $L_0$: initial length of resonator m: order of each mode $$\lambda_{Gr0} = 2d \sin \theta_0 \quad (2)$$

wherein:

$\lambda_{Gr0}$: initial oscillation wavelength d: interval of the grooves $\theta_0$: initial angle of inclination of diffraction grating In FIG. 2, diffraction grating 3, which acts as an external mirror of semiconductor laser 1, is fixed on rotating stage 4 which includes a mechanism which moves in parallel with the optical axis of the semiconductor laser. Furthermore, the rotating stage 4 is connected to fixed plate 10 via arm 7. Therefore, the rotational motion of diffraction grating 3 is transformed into parallel motion, and length L of the external resonator varies by $\Delta L$. Here, external resonance longitudinal modes $\lambda_{FP}$ (the interval of modes is represented by "$\lambda_{FP}^2/[2\{L_0+\Delta L\}]$") which correspond to the rotational angle $\Delta\theta$ of diffraction grating 3, and wavelength $\lambda_{Gr}$ which is selected as the oscillation wavelength via diffraction grating 3 are respectively represented by the following formulas (3) and (4).

$$\begin{aligned}\lambda_{FP} &= 2(L_0+\Delta L)/m \\ &= 2[L_A \cdot \sin(\theta_0+\Delta\theta)]/m\end{aligned} \quad (3)$$

wherein:

$\lambda_{FP}$: external resonance longitudinal modes $\Delta L$: variation of the length of resonator $L_A$: distance from the top of arm 7 to the center of diffraction grating $\Delta\theta$: angle of rotation $$\lambda_{Gr}=2d \sin(\theta_0+\Delta\theta) \quad (4)$$

wherein:

$\lambda_{Gr}$: oscillation wavelength

Wavelength error $\Delta\lambda$, that is, the difference between oscillation wavelength $\lambda_{Gr}$ chosen by means of diffraction grating 3 and corresponding external resonance longitudinal mode $\lambda_{FP}$, is represented by the following formula (5). Therefore, if length 1 of arm 7 is set such that the condition "$L_A = m \cdot d$" is satisfied, the wavelength error $\Delta\lambda$ is always maintained at zero, regardless of the rotational angle $\Delta\lambda$ of diffraction grating 3.

$$\begin{aligned}\Delta\lambda &= \lambda_{FP} - \lambda_{Gr} \\ &= 2[L_A \cdot \sin(\theta_0+\Delta\theta)]/m - \\ &\quad 2d\sin(\theta_0+\Delta\theta) \\ &= 2\sin(\theta_0+\Delta\theta)\cdot\{L_A/m - d\}\end{aligned} \quad (5)$$

wherein:

$\Delta\lambda$: wavelength error

Accordingly, diffraction grating 3, arm 7, and fixed plate 10 constitute a linear feed for wavelengths (hereinafter, the constitution is referred to as a "sine bar"). Therefore, it is possible to vary the oscillation wavelength under phase-continuous conditions, wherein order m of the oscillation mode is fixed (i.e., the jump of the oscillation mode does not occur).

On the other hand, outgoing beam 2A from the other end face without an antireflection film of semiconductor laser 1 is transformed into a collimated beam via lens 5; and the collimated beam becomes an output beam from the external resonator type wavelength-variable semiconductor laser light source.

In the external resonator type wavelength-variable semiconductor laser light source using the sine bar, the wavelength error $\Delta\lambda$ is always maintained at zero for the angle $\Delta\theta$ of rotation of the diffraction grating; thus, it is possible to vary the oscillation wavelength under phase-continuous conditions, wherein order m of the oscillation modes is fixed (i.e., the jump of the oscillation mode does not occur). However, if there occurs any setting error in the interval of grooves in the diffraction grating, the position of the fixed plate, the length of the arm, or the position at which the beam is incident on the diffraction grating, and the like, wavelength error $\Delta\lambda$ gradually increases for the rotational angle $\Delta\theta$. Then, if wavelength error $\Delta\lambda$ exceeds the interval of the external resonance longitudinal modes, the jump of oscillation mode occurs. In this case, the range of wavelength-variation under phase-continuous conditions is limited to a narrow one.

For example, if the position of the incident beam on the diffraction grating has an error in a direction perpendicular to the optical axis of the semiconductor laser, the position error of the incident beam is included in formula (5). In this case, even if length 1 of arm 7 is adjusted such that the condition "$L_A = m \cdot d$" is satisfied, the wavelength error $\Delta\lambda$ gradually increases for the angle $\Delta\theta$ of rotation of the diffraction grating. Therefore, for the purpose of achieving a wide range of wavelength variation under phase-continuous conditions, the position error of the incident beam on the diffraction grating must be minimized as much as possible.

However, in the sine bar arrangement of the conventional external resonator type wavelength-variable semiconductor laser light source shown in FIG. 2, the physical length of the external resonator is changed by moving the diffraction grating at the time of wavelength variation; thus, the conventional light source has a problem, that is, a problem occurs in that the accuracy of parallel movement of the rotating stage directly influences the position error of incident beam.

SUMMARY OF THE INVENTION

Therefore, the purpose of the present invention is to solve the above-mentioned problem of the conventional technology and to provide an external resonator type wavelength-variable semiconductor laser light source adopting a "sine bar" method, in which the oscillation wavelength of the semiconductor laser can be varied within a wide range under phase-continuous conditions.

Therefore, the present invention provides an external resonator type wavelength-variable semiconductor laser light source comprising: a semiconductor laser whose one end face is coated with an antireflection film; a diffraction grating for inputting an outgoing beam from the end face coated with the antireflection film so as to form an external resonator with the other end face of the semiconductor laser; a rotating stage which holds the diffraction grating; a first prism having a slope, which prism is fixed at a position between the semiconductor laser and the diffraction grating, the outgoing beam from the end face coated with the antireflection film of the semiconductor laser transmitting the first prism; a second prism which is combined with the first prism in a manner such that the second prism slides on the slope of the first prism, the second prism being connected to the rotating stage via an arm, and the outgoing beam from the end face coated with the antireflection film of the semiconductor laser transmitting the second prism, wherein when the second prism slides on the slope of the first prism, the arm works together and the diffraction grating fixed on the rotating stage rotates.

In the above arrangement, the outgoing beam from the end face coated with the antireflection film of the semiconductor laser transmits the second prism, which slides on the slope of the first prism, and the first prism, to be incident on the diffraction grating which is fixed on the rotating stage. When the wavelength of the semiconductor laser is varied by rotating the rotating stage, the second prism is moved along the slope of the first prism; thus, the oscillation wavelength of the semiconductor laser is varied within a wide range under phase-continuous conditions by the rotation of the diffraction grating.

According to the external resonator type wavelength-variable semiconductor laser light source of the present invention, the diffraction grating, the arm, and the second prism form a sine bar. Accordingly, when the wavelength of the semiconductor laser is varied by rotating the diffraction grating, the optical length of the beam which transmits the second prism changes, wherein the physical length of the external resonator does not change, while in the conventional arrangement, the physical length of the external resonator is changed by moving the diffraction grating in parallel with the optical axis of the semiconductor laser. Therefore, in the present invention, any position error of the incident beam to the diffraction grating in accordance with the change of the length of resonator does not occur, and the oscillation wavelength of semiconductor laser can be varied within a wide range under phase-continuous conditions.

DESCRIPTION OF PREFERRED EMBODIMENTS

Figure 1:
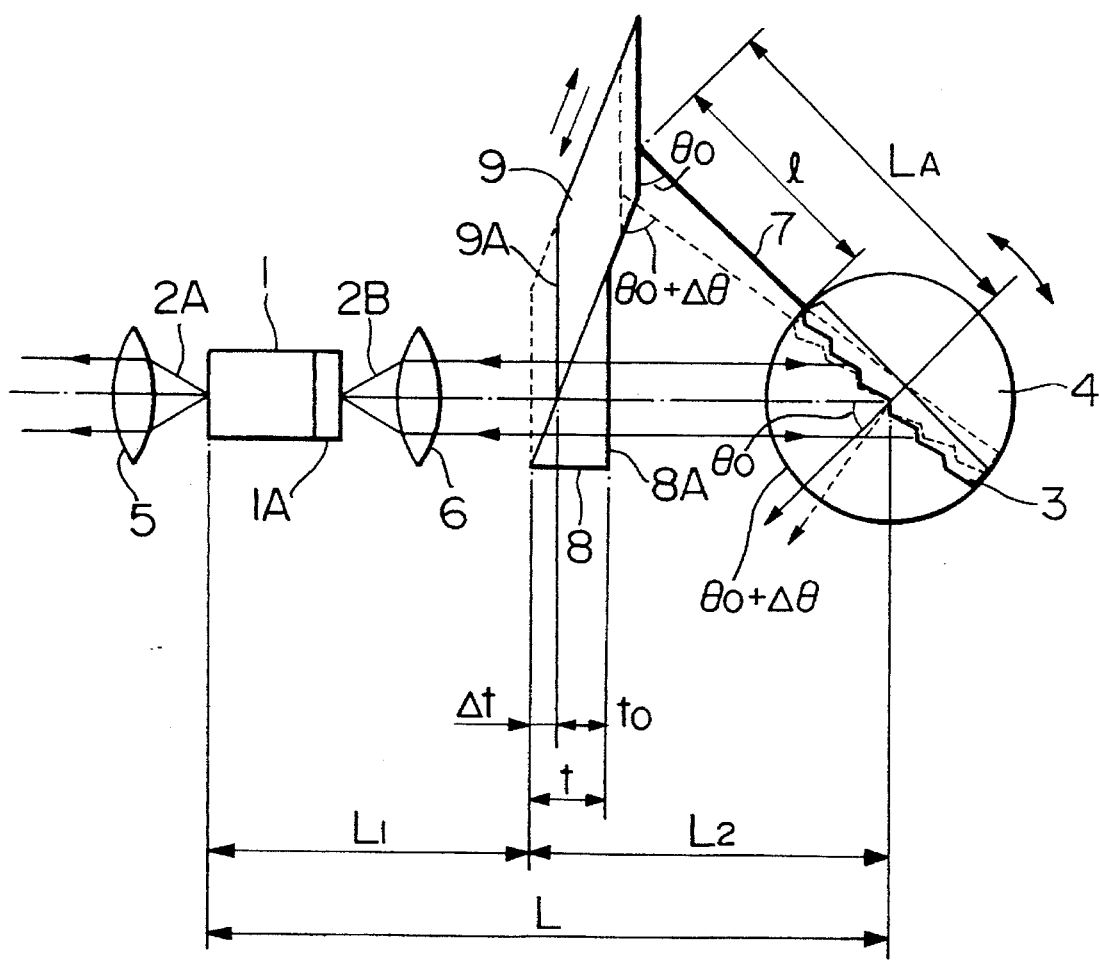
FIG. 1 is a block diagram showing the external resonator type wavelength-variable semiconductor laser light source according to an embodiment of the present invention.

FIG. 1 is a block diagram showing the external resonator type wavelength-variable semiconductor laser light source according to an embodiment of the present invention, which is used, for example, for optical coherent communication.

Figure 2:
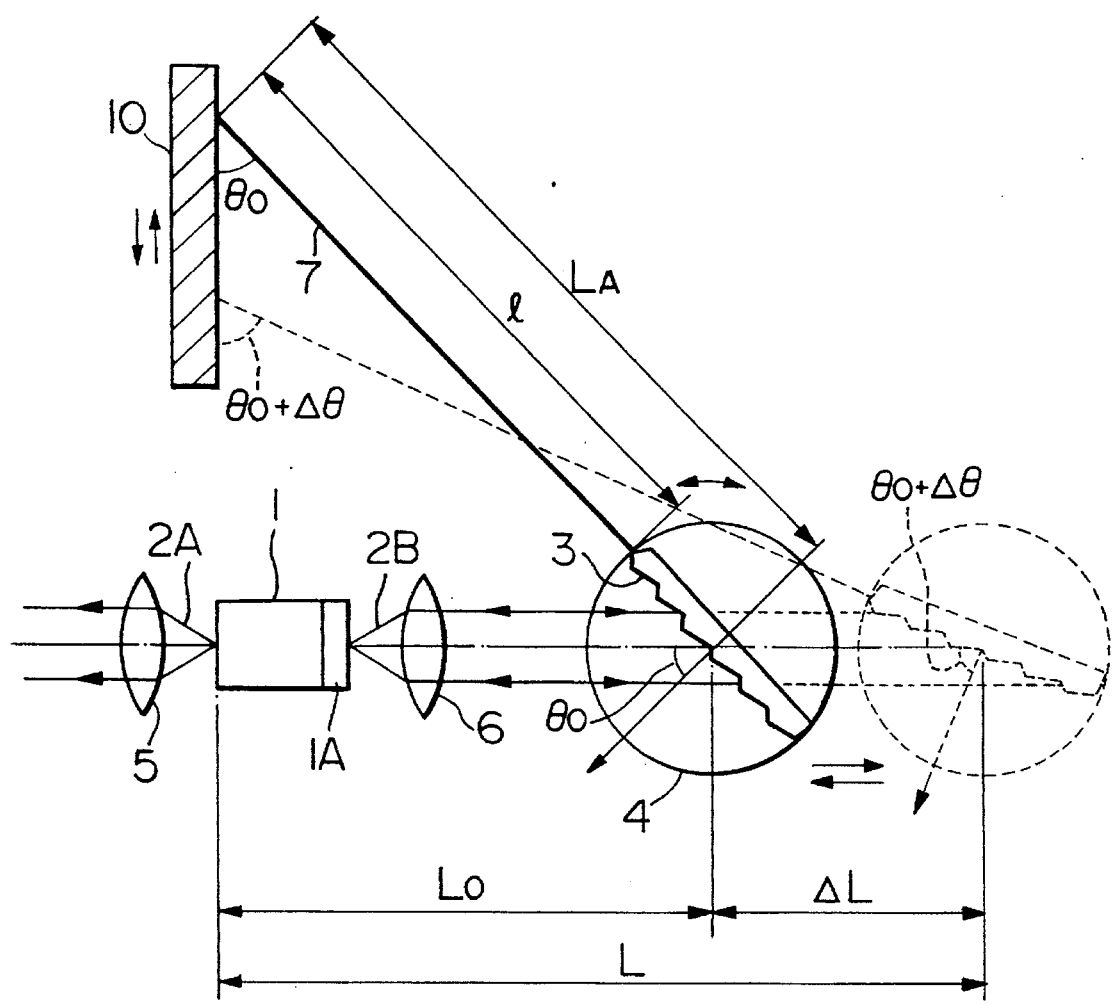
FIG. 2 is a block diagram showing a conventional external resonator type wavelength-variable semiconductor laser light source.

In this embodiment, the following difference from the arrangement shown in FIG. 2 exists; that is, instead of having rotating stage 4 connected to fixed plate 10 via arm 7, the rotating stage 4 is connected to parallelogrammatic prism 9 via arm 7, which prism slides on a slope of triangular prism 8. In the FIG. 1, parts which are identical to those shown in FIG. 2 are given identical reference numbers.

In FIG. 1, semiconductor laser 1 outputs outgoing beam 2B from the end face with antireflection film 1A. The output beam 2B is transformed into a collimated beam by lens 6 and is transmitted through (i) triangular prism 8 which is fixed at a position between semiconductor laser 1 and diffraction grating 3, one end face of prism 8 being coated with antireflection film 8A and prism 8 having refractive index n, and (ii) parallelogrammatic prism 9 which is combined with triangular prism 8, one end face of prism 9 being coated with antireflection film 9A and prism 9 having refractive index n. Then, the beam 2B is incident on diffraction grating 3 which has grooves whose interval is d, the diffraction grating being placed in a direction inclined by angle $\theta_0$ to a direction along the optical axis of semiconductor laser 1.

At this time, the central part of the diffraction grating 3 and the other end face without an antireflection film of the semiconductor laser 1 form an external resonator which has initial length $L_0$. Therefore, semiconductor laser 1 oscillates at initial wavelength $\lambda_{Gr0}$ which corresponds to a mode selected among initial external resonance longitudinal modes $\lambda_{FP0}$ to satisfy the condition that the optical loss in the resonator is the smallest via the diffraction grating 3. Here, initial external resonance longitudinal modes $\lambda_{FP0}$ satisfy the following formula (6), and initial wavelength $\lambda_{Gr0}$ is represented by the following formula (7).

$$\lambda_{FP0} = 2L_0/m \qquad (6)$$
$$= 2\{L1 + L2 + t_0(n-1)\}/m$$

wherein:

$\lambda_{FP0}$: initial external resonance longitudinal modes $L_0$: initial length of resonator m: order of each mode L1: initial set distance 1 (see FIG. 1)

L2: initial set distance 2 (see FIG. 1)

n: refractive index $t_0$: initial overlapping width of the parallelogrammatic prism and the triangular prism $$\lambda_{Gr0} = 2d \sin \theta_0 \quad (7)$$

wherein:

$\lambda_{Gr0}$: initial oscillation wavelength d: interval of the grooves $\theta_0$: initial angle of inclination of diffraction grating Here, parallelogrammatic prism 9 has a mechanism which allows the prism slide on a slope of triangular prism 8 which is provided between semiconductor laser 1 and diffraction grating 3. In addition, rotating stage 4 which holds diffraction grating 3 is connected to parallelogrammatic prism 9 via arm 7. Therefore, the rotational motion of diffraction grating 3 is transformed into the sliding motion of parallelogrammatic prism 9. Corresponding to amount $\Delta t$ (see FIG. 1) of displacement of parallelogrammatic prism 9 in the direction along the optical axis of the semiconductor laser in accordance with the sliding movement of prism 9, the optical length of the transmitting beam through parallelogrammatic prism 9 varies by $\Delta L$.

Here, external resonance longitudinal modes $\lambda_{FP}$ (the interval of modes is represented by "$\lambda_{FP}^2/[2\{L_0+\Delta L\}]$") which correspond to the rotational angle $\Delta\theta$, and wavelength $\lambda_{Gr}$ which is selected via diffraction grating 3 as the oscillation wavelength are respectively represented by following formulas (8) and (9).

$$\begin{aligned}\lambda_{FP} &= 2(L_0 + \Delta L)/m \quad (8)\\ &= 2\{L1 + L2 + t_0(n-1) + \\ &\quad (n-1)\cdot[L_A\cdot\sin(\theta_0+\Delta\theta) - L_A\cdot\sin(\theta_0)]\}/m\end{aligned}$$

wherein:

$\lambda_{FP}$: external resonance longitudinal modes $\Delta L$: variation of the length of resonator $L_A$: distance from the top of arm to the center of diffraction grating $\Delta\theta$: angle of rotation $$\lambda_{Gr} = 2d \sin(\theta_0 + \Delta\theta) \quad (9)$$

wherein:

$\lambda_{Gr}$: oscillation wavelength

Wavelength error $\Delta\lambda$, that is, the difference between oscillation wavelength $\lambda_{Gr}$ chosen by means of diffraction grating 3 and corresponding external resonance longitudinal mode $\lambda_{FP}$ is represented by the following formula (10). Therefore, if length 1 of arm 7 is set such that the condition "$L_A = m\cdot d/(n-1)$" is satisfied and L1 and L2 are set such that the condition "$L1+L2=(n-1)\cdot\{L_A\sin(\theta_0)-t_0\}$" is satisfied, then the wavelength error $\Delta\lambda$ is always maintained at zero, regardless of the rotational angle $\Delta\theta$ of the diffraction grating 3.

$$\begin{aligned}\Delta\lambda &= \lambda_{FP} - \lambda_{Gr} \quad (10)\\ &= 2\{L1 + L2 + t_0(n-1) + \\ &\quad (n-1)\cdot[L_A\cdot\sin(\theta_0+\Delta\theta) - \\ &\quad L_A\cdot\sin(\theta_0)]\}/m - \\ &\quad 2d\sin(\theta_0+\Delta\theta)\\ &= 2[L1 + L2 + t_0(n-1)]/m - \\ &\quad 2[(n-1)L_A\cdot\sin(\theta_0)]/m + \\ &\quad 2\sin(\theta_0+\Delta\theta)\cdot\{L_A(n-1)/m - d\}\end{aligned}$$

wherein:

$\Delta\lambda$: wavelength error

Accordingly, diffraction grating 3, arm 7, and parallelogrammarie prism 9 form a sine bar; thus, it is possible to vary the oscillation wavelength under phase-continuous conditions in which order m of the oscillation mode is fixed (i.e., the jump of the oscillation mode does not occur).

In an example case in which: interval d of diffraction grating 3 is (1/1200) mm; order m of mode is 46,800; initial overlapping width $t_0$ of triangular prism 8 and parallelogrammatic prism 9 is 10 mm; and BK7 (optical glass: n=1.5) is used as material for the triangular prism 8 and the parallelogrammatic prism 9, the wavelength can be varied under phase-continuous conditions when length 1 of arm 7 and initial set distances L1 and L2 are adjusted such that the conditions "$L_A$=78 mm" and "L1+L2=31.27 mm" are satisfied. In addition, if SF11 (optical glass: n=1.74) is used as material for the triangular prism 8 and the parallelogrammatic prism 9, the wavelength can be varied under phase-continuous conditions when length 1 of arm 7 and initial set distances L1 and L2 are adjusted such that the conditions "$L_A$=52.70 mm" and L1+L2=28.87 mm are satisfied.

Moreover, triangular prism 8 in the present embodiment may be substituted for a parallelogrammatic prism or a trapezoidal prism, while parallelogrammatic prism 9 may be substituted for a trapezoidal prism, and the like.

On the other hand, outgoing beam 2A from the other end face without an antireflection film of semiconductor laser 1 is transformed into a collimated beam via lens 5; and the collimated beam becomes an output beam from the external resonator type wavelength-variable semiconductor laser light source.

What is claimed is:

1. An external resonator type wavelength-variable semiconductor laser light source comprising:

a semiconductor laser having two end faces; one end face being coated with an antireflection film, the semiconductor laser generating a beam which is transmitted through the antireflection film as an outgoing beam;

a diffraction grating, inclined with respect to the optical axis of the semiconductor laser at an inclination angle, for reflecting the outgoing beam from the end face coated with antireflection film so as to form an external resonator with the other end face of the semiconductor laser, whereby a pumped laser beam is outputted from the other end face of the semiconductor laser as an output beam from the external resonator type wavelength-variable semiconductor laser light source;

a rotating stage which holds the diffraction grating;

a first prism having a slope, said prism being fixed at a position between the semiconductor laser and the diffraction grating, the outgoing beam from the end face coated with the antireflection film of the semiconductor laser being transmitted through the first prism; and a second prism which is combined with the first prism in a manner such that the second prism slides on the slope of the first prism, the second prism being connected to the rotating stage via an arm, the outgoing beam from the end face coated with the antireflection film of the semiconductor laser being transmitted through the second prism, and the second prism having a shape such that an optical length of a beam transmitted through the second prism varies while the second prism slides on the slope;

wherein, when the second prism slides on the slope of the first prim, the arm cooperates with the second prism and rotates the rotating stage connected with the arm, and the diffraction grating fixed on the rotating stage also rotates to vary the inclination angle of the diffraction grating, whereby the wavelength of the output beam of the semiconductor laser light source varies.

2. An external resonator type wavelength-variable semiconductor laser light source according to claim 1, wherein the first prism is a triangular prism.

3. An external resonator type wavelength-variable semiconductor laser light source according to claim 2, wherein the second prism is a parallelogrammatic prism.

4. An external resonator type wavelength-variable semiconductor laser light source according to claim 2, wherein the second prism is a trapezoidal prism.

5. An external resonator type wavelength-variable semiconductor laser light source according to claim 1, wherein the first prism is a parallelogrammatic prism.

6. An external resonator type wavelength-variable semiconductor laser light source according to claim 1, wherein the first prism is a trapezoidal prism.

* * * * *